United States Patent
Lee et al.

(10) Patent No.: US 8,963,151 B2
(45) Date of Patent: Feb. 24, 2015

(54) NITRIDE-BASED HETEROSTRUCTURE FIELD EFFECT TRANSISTOR HAVING HIGH EFFICIENCY

(75) Inventors: Jae Hoon Lee, Suwon-si (KR); Ki Se Kim, Suwon-si (KP)

(73) Assignee: Samsung Electronics Co., Ltd., Suwon-Si, Seoul (KR)

( * ) Notice: Subject to any disclaimer, the term of this patent is extended or adjusted under 35 U.S.C. 154(b) by 0 days.

(21) Appl. No.: 13/226,108

(22) Filed: Sep. 6, 2011

(65) Prior Publication Data

US 2012/0280233 A1   Nov. 8, 2012

(30) Foreign Application Priority Data

May 3, 2011   (KR) .................. 10-2011-0041763

(51) Int. Cl.
| | |
|---|---|
| *H01L 29/165* | (2006.01) |
| *H01L 29/778* | (2006.01) |
| *H01L 29/872* | (2006.01) |
| *H01L 29/16* | (2006.01) |
| *H01L 29/20* | (2006.01) |

(52) U.S. Cl.
CPC .......... *H01L 29/7787* (2013.01); *H01L 29/872* (2013.01); *H01L 29/1608* (2013.01); *H01L 29/2003* (2013.01)
USPC ............ 257/57; 257/77; 257/66; 257/E29.08; 257/E29.081

(58) Field of Classification Search
CPC .................... H01L 21/02378; H01L 29/66462
USPC ............. 257/52, 57, 65, 73, 76, 77, 155, 183, 257/192, 194, 200, 471, 472, 473
See application file for complete search history.

(56) References Cited

U.S. PATENT DOCUMENTS

| | | | | |
|---|---|---|---|---|
| 7,141,498 | B2 * | 11/2006 | Malhan et al. | 438/682 |
| 7,169,666 | B2 * | 1/2007 | Forbes et al. | 438/257 |
| 7,224,004 | B2 * | 5/2007 | Kikkawa | 257/194 |
| 7,629,632 | B2 * | 12/2009 | Twynam | 257/260 |
| 7,646,025 | B1 | 1/2010 | Sung | |
| 7,898,004 | B2 * | 3/2011 | Wu et al. | 257/194 |
| 2006/0154454 | A1 | 7/2006 | Jeon et al. | |
| 2008/0210988 | A1 | 9/2008 | Twynam | |
| 2009/0042345 | A1 * | 2/2009 | Saxler et al. | 438/172 |
| 2010/0258848 | A1 * | 10/2010 | Lidow et al. | 257/288 |
| 2011/0266557 | A1 * | 11/2011 | Mieczkowski et al. | 257/77 |

FOREIGN PATENT DOCUMENTS

| | | | | | |
|---|---|---|---|---|---|
| JP | 2005-101212 | * | 4/2005 | | H01L 33/00 |
| KR | 10-2004-0063073 A | * | 7/2004 | | H01L 33/00 |

OTHER PUBLICATIONS

"Silicon Carbide", Apr. 20, 2010, http://en.wikipedia.org/wiki/Silicon_carbide.*

(Continued)

*Primary Examiner* — Kimberly Rizkallah
*Assistant Examiner* — Mounir Amer
(74) *Attorney, Agent, or Firm* — McDermott Will & Emery LLP (57) ABSTRACT

A high efficiency HFET may include a substrate, a semi-insulating gallium nitride (GaN) layer formed on the substrate, an aluminum gallium nitride (AlGaN) layer formed on the GaN layer, and a silicon carbide ($Si_xC_{1-x}$) functional layer formed on the AlGaN layer.

11 Claims, 7 Drawing Sheets

(56) References Cited

OTHER PUBLICATIONS

Jae Hoon Lee et al., "Reduction of AlGaN surface leakage current by in situ deposition of a $Si_xC_{1-x}$ cap layer," South Korea; Feb. 18, 2011; 3 pages; Publisher in Sep. 6, 2011.

Semiconductor beyond IT, The 18th Korean Conference on Semiconductors, Feb. 16, 2011, w/ English translation thereof.
"Reduction of AlGaN surface leakage current by in situ deposition of a $Si_xC_{1-x}$, cap layer,".
Taiwanese Office Action issued in Taiwanese Application No. 100128493 dated Jan. 6, 2014.

* cited by examiner

NITRIDE-BASED HETEROSTRUCTURE FIELD EFFECT TRANSISTOR HAVING HIGH EFFICIENCY

CROSS-REFERENCE TO RELATED APPLICATIONS

This application claims the benefit under 35 U.S.C. §119(a) of Korean Patent Application No. 10-2011-0041763, filed on May 3, 2011, in the Korean Intellectual Property Office, the entire disclosure of which is incorporated herein by reference for all purposes.

BACKGROUND

1. Field

The following description relates to a nitride-based heterostructure field effect transistor (HFET), and more particularly, to a high efficiency nitride-based HFET capable of suppressing a leakage current of an HFET and enhancing a current density by lowering an barrier between an electrode and a semiconductor layer.

2. Description of Related Art

Recently, communications technology has developed rapidly for a high speed and high capacity signal transmission in response to global growth in information and communications technology fields. In particular, an expanding demand for a personal mobile phone, satellite communication, a military radar system, broadcast communication, a repeater for communication, and the like in wireless communication technology may lead to an increased demand for a high speed and high power electronic device to be used by an ultra high speed information and communications system in a micro-wave and millimeter wave band. Consequently, research into reducing energy loss in a power source/component used for a high power electronic device is being conducted.

A gallium nitride (GaN) based nitride semiconductor has been actively studied since the GaN based nitride semiconductor can easily be applied to a high frequency and high power electronic device as well as an optical device due to excellent properties such as a high energy gap, a high thermal and chemical stability, a high saturation velocity of about $3 \times 10^7$ cm/sec, and the like.

An electric device using the GaN based nitride semiconductor may have additional merits such as, a high breakdown electric field of about $3 \times 10^6$ V/cm, a maximized current density, a stable high-temperature operation, a high thermal conductivity, and the like. A heterostructure field effect transistor (HFET) using heterostructure semiconductor materials such as aluminum gallium nitride (AlGaN) and GaN may have a relatively high valence-band discontinuity at a heterojunction contact interface and thus, a high density of electrons may be induced and electron mobility may be enhanced, thereby enabling application in a high power device.

Figure 1:
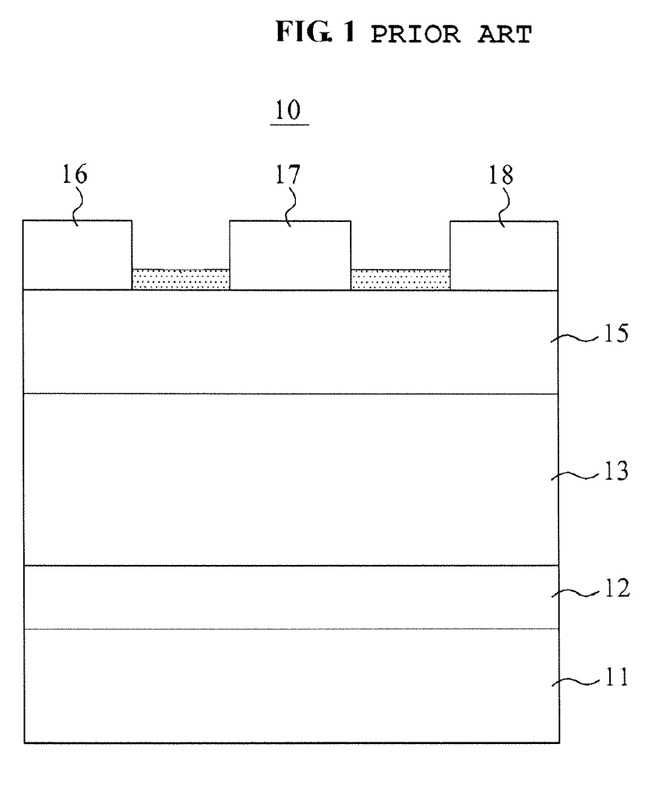
FIG. 1 is a cross-sectional view illustrating an example of a heterostructure field effect transistor (HFET) according to conventional art.

FIG. 1 illustrates a basic configuration of a conventional nitride-based HFET 10.

Referring to FIG. 1, the conventional nitride-based HFET 10 may include a low temperature buffer layer 12, a semi-insulating or high resistance GaN layer 13, and an AlGaN layer 15 each respectively formed in order on a sapphire substrate 11. A source electrode 16 and a drain electrode 18 may be formed at both ends of the AlGaN layer 15, and a gate electrode 17 may be formed between the source electrode 16 and the drain electrode 18.

The nitride-based HFET 10 may include a two-dimensional electron gas (2DEG) layer formed due to a heterostructure of the GaN layer 13 and the AlGaN layer 15 having different bandgaps. Here, a channel may be formed through the 2DEG layer in response to a signal inputted to the gate electrode 17, enabling a current to flow between the source electrode 16 and the drain electrode 18. The GaN layer 13 may be formed as a non-doped GaN layer having a relatively high resistance, to prevent a leakage current with respect to the sapphire substrate 11 and to isolate devices.

SUMMARY

Embodiments of the present invention provides a high efficiency nitride-based heterostructure field effect transistor (HFET) capable of suppressing a leakage current and enhancing a current density by lowering a barrier between an electrode and a semiconductor layer.

According to an embodiment of the present invention, there is provided an HFET including a substrate, a semi-insulating gallium nitride (GaN) layer formed on the substrate, an aluminum gallium nitride (AlGaN) layer formed on the GaN layer, and a silicon carbide ($Si_xC_{1-x}$) functional layer formed on the AlGaN layer.

x of the $Si_xC_{1-x}$ functional layer may have a value in a range of 0<x<1.

The $Si_xC_{1-x}$ functional layer may correspond to one of a single crystal, a poly-crystal, and an amorphous.

According to another embodiment of the present invention, the $Si_xC_{1-x}$ functional layer may be formed through an in-situ operation by metal organic chemical vapor deposition (MOCVD).

According to another embodiment, a low-temperature GaN layer may be formed on the $Si_xC_{1-x}$ functional layer.

According to another embodiment, a low-temperature GaN layer may be formed under the $Si_xC_{1-x}$ functional layer.

According to another embodiment, a protection layer including at least one material selected from a group consisting of silicon nitride ($Si_xN$), silicon oxide ($SiO_x$), and aluminum oxide ($Al_2O_3$) may be formed on the $Si_xC_{1-x}$ functional layer.

According to another embodiment, the substrate may include at least one material selected from a group consisting of sapphire, silicon, aluminum nitride (AlN), silicon carbide (SiC), and GaN.

According to another embodiment, a buffer layer including at least one material selected from a group consisting of AlN, SiC, and GaN may be formed on the substrate.

According to another embodiment, the HFET may correspond to one of a normally on device, a normally off device, and a Schottky barrier diode.

According to another embodiment of the present invention, the HFET may further include a GaN layer doped with Al that is disposed between the semi-insulating GaN layer formed on the substrate and the AlGaN layer formed on the GaN layer.

Other features and aspects of the present invention will be apparent from the following detailed description, the drawings, and the claims.

BRIEF DESCRIPTION OF THE DRAWINGS

Throughout the drawings and the detailed description, unless otherwise described, like drawing reference numerals will be understood to refer to like elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

Throughout the specifications, when a description is provided in relation to a substrate, a layer, a pattern, and the like formed "on" or "under" a substrate, a layer, a pattern, and the like, the term "on" may include "directly on" and "indirectly on interposing another element therebetween," and the term "under" may include "directly under" and "indirectly under interposing another element therebetween." A standard for "on" or "under" of each element may be determined based on a corresponding drawing.

Hereinafter, embodiments will be described with reference to drawings.

Figure 2:
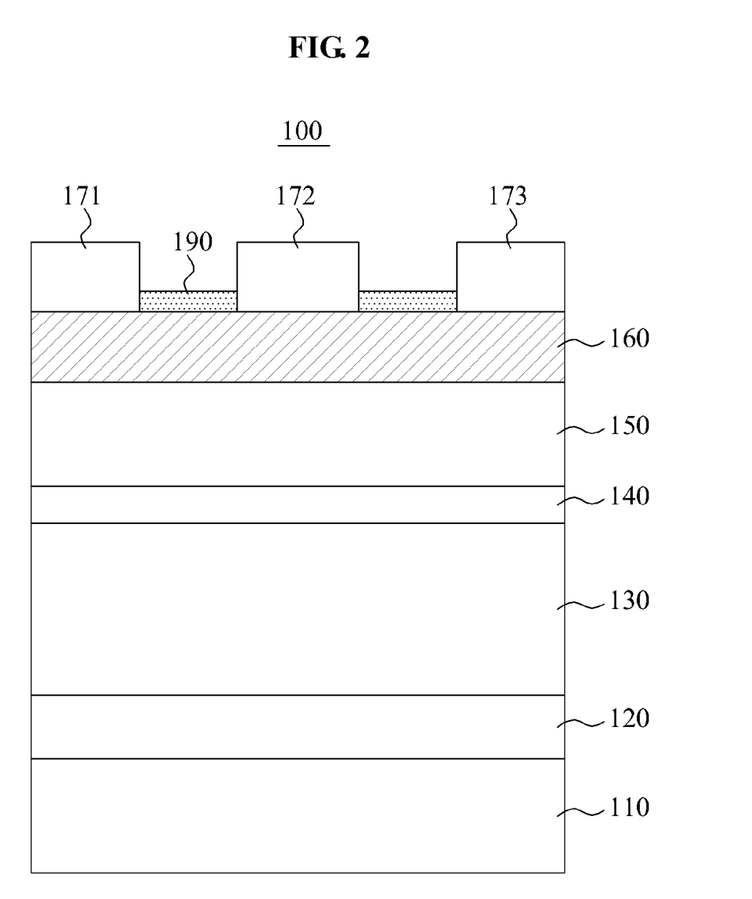
FIG. 2 is a cross-sectional view illustrating an example of an HFET according to an embodiment.

FIG. 2 illustrates an example of a heterostructure field effect transistor (HFET) 100 according to an embodiment.

Referring to FIG. 2, the HFET 100 may include a substrate 110, a buffer layer 120, a semi-insulating gallium nitride (GaN) layer 130, a GaN layer 140 doped with aluminum, an aluminum gallium nitride (AlGaN) layer 150, and a silicon carbide ($Si_xC_{1-x}$) functional layer 160.

The substrate 110 may be formed using various materials based on a lattice constant, a thermal expansion coefficient, and the like of a nitride semiconductor layer such as the semi-insulating GaN layer 130 and the AlGaN layer 150. For example, the substrate 110 may include at least one material selected from a group consisting of sapphire, silicon, aluminum nitride (AlN), silicon carbide (SiC), and GaN.

The buffer layer 120 may be formed on the substrate 110. Here, the buffer layer 120 may be formed by a composite of SiC and GaN. The buffer layer 120 may enhance a stability of the HFET 100 by minimizing a difference in a lattice constant, a thermal expansion coefficient, and the like of the nitride semiconductor layer such as the semi-insulating GaN layer 130 and the AlGaN layer 150. For example, the buffer layer 120 may include at least one material selected from a group consisting of AlN, SiC, and GaN, but may not be limited thereto.

The semi-insulating GaN layer 130 may be formed on the buffer layer 120. The semi-insulating GaN layer 130 may prevent a leakage current associated with the substrate 110, and have a relatively high resistance for an isolation between devices. That is the semi-insulating GaN layer 130 may have a semi-insulating property due to a relatively high resistance.

The GaN layer 140 doped with aluminum may be formed on the semi-insulating GaN layer 130 to function as a channel layer. The GaN layer 140 doped with aluminum may enhance crystallinity of the GaN layer 140 through inhibiting of a two-dimensional (2D) potential and three-dimensional (3D) potential by passivating a gallium vacancy (Ga vacancy) included in the GaN layer 140 as a defect due to aluminum. When a high quality two-dimensional electron gas (2DEG) layer is formed in the GaN layer 140 that is doped with aluminum and has enhanced crystallinity, a scattering due to a Ga vacancy and other defects may be relatively low during a movement of an electron in the 2DEG layer, thereby leading to an increase of mobility.

The AlGaN layer 150 may be formed on the GaN layer 140 doped with aluminum, and the $Si_xC_{1-x}$ functional layer 160 may be formed on the AlGaN layer 150. A source electrode 171 and a drain electrode 173 may be formed at both ends of the $Si_xC_{1-x}$ functional layer 160, and a gate electrode 172 may be formed between the source electrode 171 and the drain electrode 173. A protection layer 190 may be formed between the source electrode 171 and the gate electrode 172 on the $Si_xC_{1-x}$ functional layer 160, and be formed between the gate electrode 172 and the drain electrode 173 on the $Si_xC_{1-x}$ functional layer 160. Here, the protection layer 190 may be formed using silicon nitride (SiN).

The protection layer 190 may be formed using at least one selected from a group consisting of silicon nitride ($Si_xN$), silicon oxide ($SiO_x$), and aluminum oxide ($Al_2O_3$). The protection layer 190 as a passivation thin film layer may reduce an unstable surface state of the $Si_xC_{1-x}$ functional layer 160 and reduce a decrease in a power characteristic due to a current collapse during a high frequency operation.

Thus, when the HFET 100 according to an aspect includes the $Si_xC_{1-x}$ functional layer 160 formed on the AlGaN layer 150, a roughness of an upper surface of the HFET 100 may be improved. A leakage current may be blocked by preventing a dangling bonding through the $Si_xC_{1-x}$ functional layer 160. During a bonding with an ohmic metal for forming a source electrode and a drain electrode, a barrier may be lowered to increase a current density, thereby maximizing an efficiency of an electronic device.

x of the $Si_xC_{1-x}$ functional layer 160 may have a value in a range of $0<x<1$. That is, silicon carbide in the $Si_xC_{1-x}$ functional layer 160 may include silicon and carbon mixed at a predetermined ratio, and a ratio of silicon and carbon may be appropriately controlled. The $Si_xC_{1-x}$ functional layer 160 formed on the AlGaN layer 150 may block a leakage current. Silicon carbide in the $Si_xC_{1-x}$ functional layer 160 may correspond to silicon rich silicon carbide for a smooth current flow between the AlGaN layer 150 and a gate electrode, or between the AlGaN layer 150 and an ohmic metal for forming an electrode, and be formed to have x, for example, in a range of $0.6<x<1$.

$Si_xC_{1-x}$, in the $Si_xC_{1-x}$ functional layer 160 may be manufactured as silicon carbide having various crystalline phases for blocking a surface leakage current, for enabling a smooth current flow between the AlGaN layer 150 and the ohmic metal, and the like. For example, $Si_xC_{1-x}$ in the $Si_xC_{1-x}$ functional layer 160 may be formed as one of a single crystal silicon carbide, a polycrystal silicon carbide, and an amorphous silicon carbide.

The $Si_xC_{1-x}$ functional layer 160 may be formed on the AlGaN layer 150 using various deposition schemes including plasma enhanced chemical vapor deposition (PECVD), and the like. For example, the $Si_xC_{1-x}$ functional layer 160 may be formed through an in-situ operation by metal organic chemical vapor deposition (MOCVD). The $Si_xC_{1-x}$ functional layer 160 may be formed using MOCVD by employing tetrabromomethane ($CBr_4$) as a carbon source and employing ditertiarybutyl silane (DTBSi) as a silicon source, and be formed through the in-situ operation after forming the AlGaN layer 150 using MOCVD. Thus, an efficiency of manufacturing an HFET may be enhanced.

A low temperature GaN may be additionally formed as a low temperature buffer layer on or under the $Si_xC_{1-x}$ functional layer 160. The low temperature GaN may enhance a stability of an HFET and improve a performance by minimizing a difference in a lattice constant and a thermal expansion coefficient between the $Si_xC_{1-x}$ functional layer 160 and various electrodes to be formed on the $Si_xC_{1-x}$ functional layer 160.

An HFET, according to an embodiment, may be applied to various types of electric devices, and be manufactured, for example, as a normally on device, a normally off device, and a Schottky barrier diode.

Figure 3:
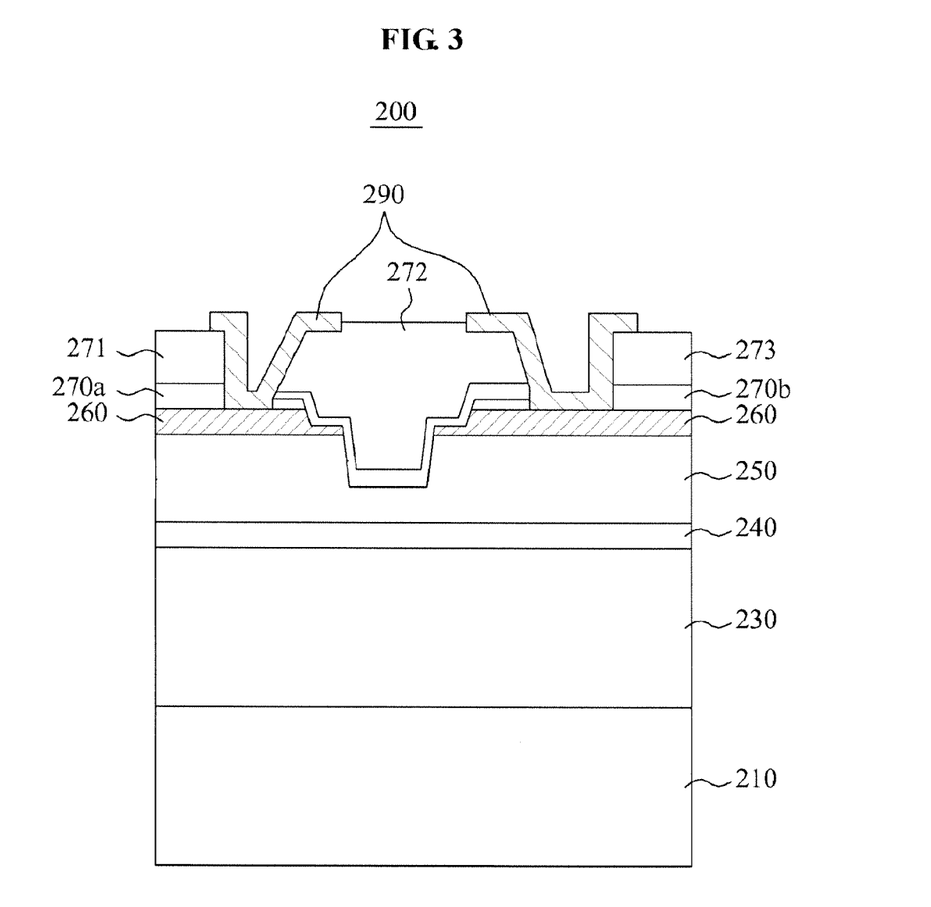
FIG. 3 is a cross-sectional view illustrating an example of an HFET according to an embodiment.

FIG. 3 illustrates an example of an HFET 200 according to an embodiment. Hereinafter, descriptions will be mainly directed to portions associated with FIG. 3 to avoid a repeated description, and other portions may be understood to be the same as described in the foregoing with reference to FIG. 2.

Referring to FIG. 3, an HFET 200 may correspond to a normally on device, and include a semi-insulating GaN layer 230 on a substrate 210, a GaN layer 240 that is doped with aluminum and formed as a channel layer, and an AlGaN layer 250 on the GaN layer 240.

A $Si_xC_{1-x}$ functional layer 260 may be formed on the AlGaN layer 250, a source electrode 271 and a drain electrode 273 connected to the AlGaN layer 250 through ohmic metals 270a and 270b may be formed at both ends of the $Si_xC_{1-x}$ functional layer 260, and a gate electrode 272 may be formed between the source electrode 271 and the drain electrode 273.

A protection layer 290 including silicon nitride ($Si_xN$) may be formed to cover sides of the source electrode 271, the drain electrode 273, and the gate electrode 272 and to cover the $Si_xC_{1-x}$ functional layer 260 between the source electrode 271 and the gate electrode 272, and between the gate electrode 272 and the drain electrode 273.

Here, a buffer layer (not shown) may be formed as mentioned in the foregoing description of FIG. 2, and may enhance stability of the HFET 200 by minimizing a difference in a lattice constant, a thermal expansion coefficient, and the like of a nitride semiconductor layer such as the semi-insulating GaN layer 230 and the AlGaN layer 250. For example, the buffer layer may include at least one material selected from a group consisting of AlN, SiC, and GaN, but may not be limited thereto.

According to an aspect, the HFET 200 illustrated in FIG. 3 may correspond to a normally off device, and have a groove structure capable of neutralizing a polarized charge, under the gate electrode 272, to decrease a dependency of a threshold voltage on a defect or thickness of the AlGaN layer 250. Thus, a controllability of a normally off characteristic used for a stable operation of an electric device may be improved while suppressing an on-resistance that may cause a power loss.

Figure 4:
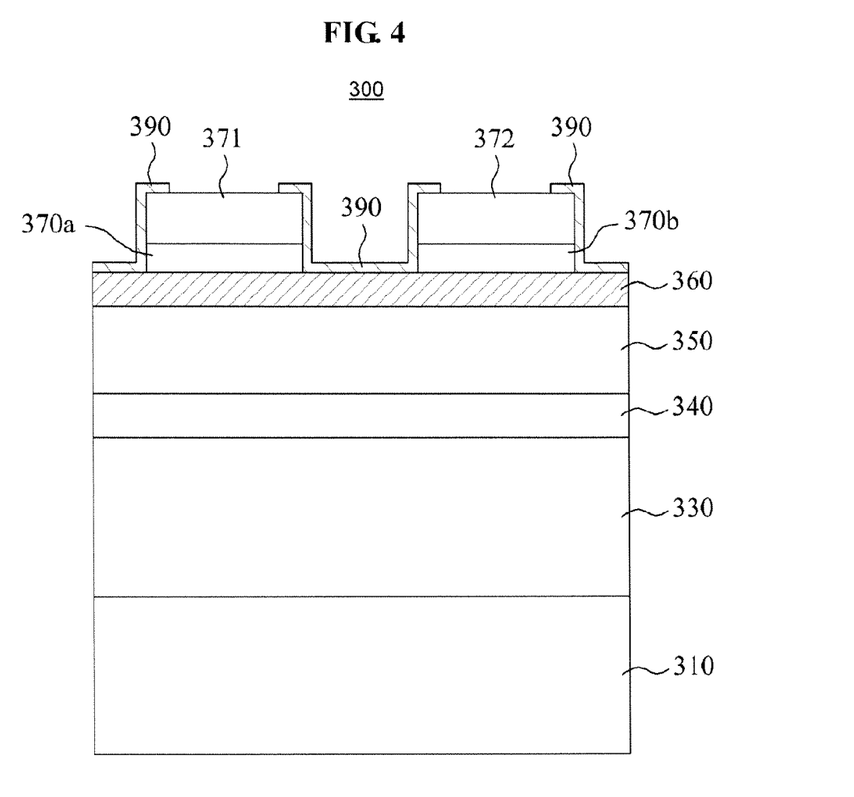
FIG. 4 is a cross-sectional view illustrating an example of an HFET according to an embodiment.

FIG. 4 illustrates an example of an HFET 300 according to an embodiment. Hereinafter, descriptions will be mainly directed to portions associated with FIG. 4 to avoid a repeated description, and other portions may be understood to be the same as described in the foregoing description with reference to FIG. 2.

Referring to FIG. 4, the HFET 300 may correspond to a Schottky barrier diode, and include a semi-insulating GaN layer 330 on a substrate 310, a GaN layer 340 that is doped with aluminum and formed as a channel layer, and an AlGaN layer 350 on the GaN layer 340.

A $Si_xC_{1-x}$ functional layer 360 may be formed on the AlGaN layer 350, and each of an anode 371 and a cathode 372 bonded to a Schottky contact 370a and bonded to an ohmic metal 370b, respectively, may be formed at both ends of the $Si_xC_{1-x}$ functional layer 360.

A protection layer 390 including $Si_xN$ may be formed to cover sides of the anode 371 and the cathode 372 and to cover the $Si_xC_{1-x}$ functional layer 360 between the anode 371 and the cathode 372.

Here, a buffer layer (not shown) may be formed as described with reference to FIG. 2, and the buffer layer may enhance stability of the HFET 300 by minimizing a difference in a lattice constant, a thermal expansion coefficient, and the like of a nitride semiconductor layer such as the semi-insulating GaN layer 330 and the AlGaN layer 350. For example, the buffer layer may include at least one material selected from a group consisting of AlN, SiC, and GaN, but not be limited thereto.

The HFET 300 as a Schottky barrier diode may have a low turn-on voltage in comparison to a p-n junction diode, and be used as a low loss and high efficiency power supply due to a relatively short reverse recovery time. A leakage current may be suppressed by preventing a short channel effect occurring due to an increase in a doping concentration of a channel region, a source region, and a drain region.

Figure 5A:
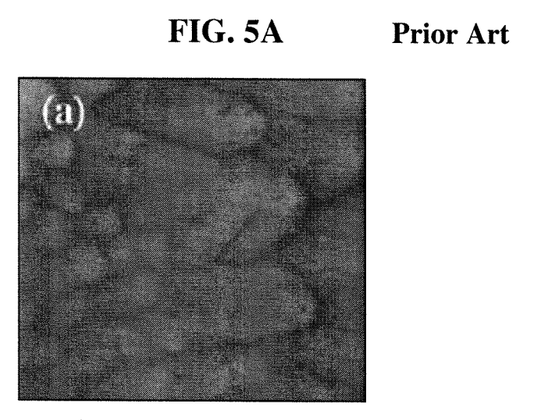
FIG. 5A is a picture of a surface of an aluminum gallium nitride (AlGaN) layer taken by an atomic force microscope according to a conventional art.

FIG. 5A is a picture of a surface of an aluminum gallium nitride (AlGaN) layer taken by an atomic force microscope according to a conventional art.

Figure 5B:
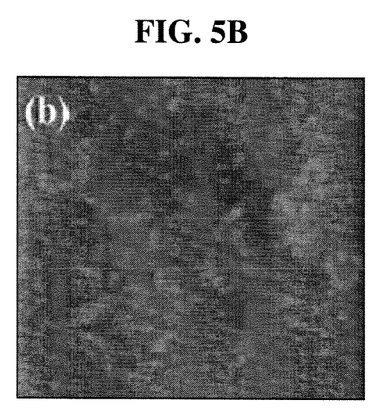
FIG. 5B is a picture of a surface of an AlGaN layer taken through an atomic force microscope according to an embodiment.

FIG. 5B is a picture of a surface of an AlGaN layer taken through an atomic force microscope according to an embodiment.

Referring to FIG. 5A, a surface of an AlGaN layer according to a conventional art may have a rough and uneven surface, and a measured root-mean-square (RMS) value of about 0.72 nm. Referring to FIG. 5B, a surface of an AlGaN layer according to an embodiment may have a smooth and even surface due to a $Si_xC_{1-x}$ functional layer, and a measured RMS value of about 0.43 nm, which is significantly small in comparison with the surface of an AlGaN layer according to a conventional art.

Figure 6:
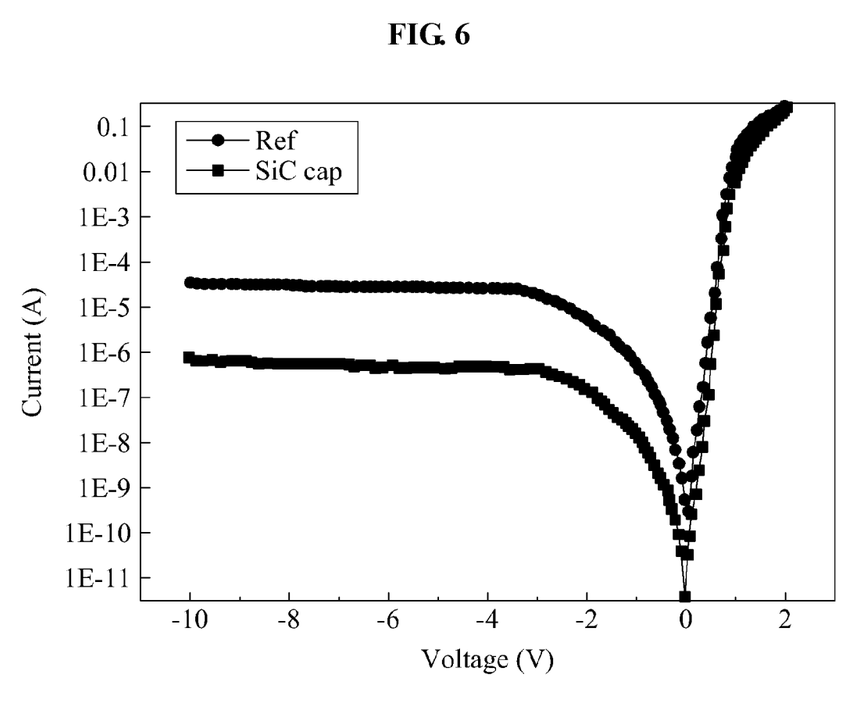
FIG. 6 is a graph illustrating a comparison of a leakage current characteristic between a conventional Schottky barrier diode having a surface of a AlGaN layer and a Schottky barrier diode having a surface of an AlGaN layer according to an embodiment.

FIG. 6 is a graph illustrating a comparison of a leakage current characteristic between a conventional Schottky barrier diode having a surface of a AlGaN layer and a Schottky barrier diode having a surface of an AlGaN layer according to an embodiment.

Figure 7:
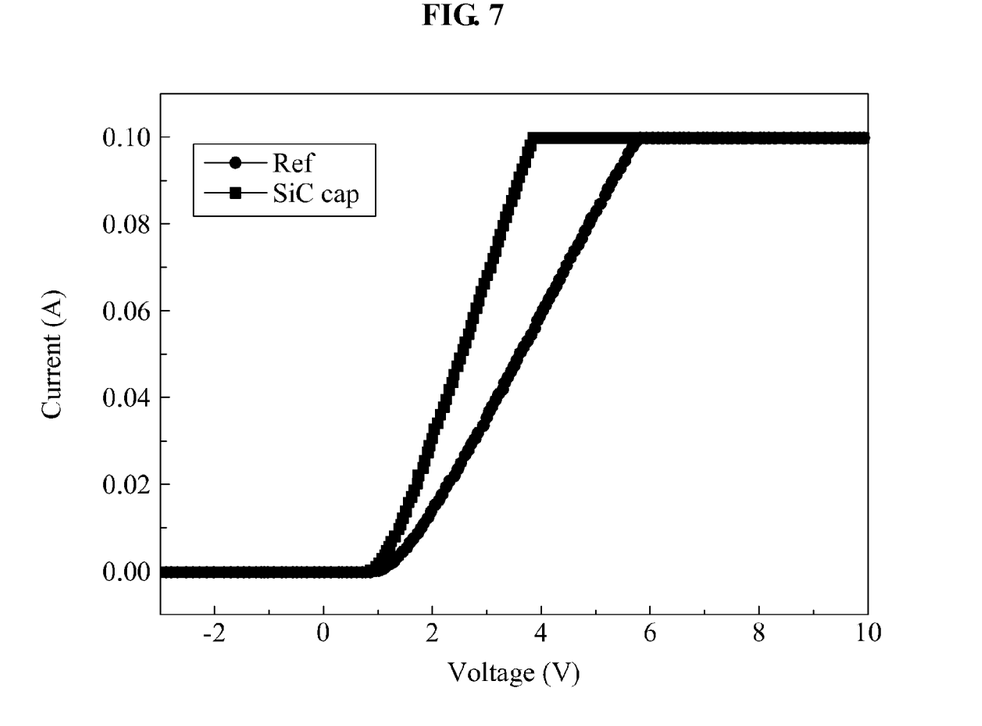
FIG. 7 is a graph illustrating a comparison of a current-voltage characteristic between a conventional Schottky barrier diode having a surface of an AlGaN layer and a Schottky barrier diode having a surface of an AlGaN layer according to an embodiment.

FIG. 7 is a graph illustrating a comparison of a current-voltage characteristic between a conventional Schottky barrier diode having a surface of an AlGaN layer and a Schottky barrier diode having a surface of an AlGaN layer according to an embodiment.

FIG. 6 illustrates that a leakage current SiC cap on a surface of an AlGaN layer according to an embodiment is lower than a leakage current(Ref) on a surface of an AlGaN layer according to a conventional art. FIG. 7 illustrates that a current density SiC cap on a surface of an AlGaN layer according to an embodiment is higher than a current density(Ref) on a surface of an AlGaN layer according to a conventional art.

According to an embodiment of the present invention, there is provided a high efficiency HFET capable of suppressing a leakage current and enhancing a current density by lowering a barrier between an electrode and a semiconductor layer.

A number of examples have been described in the foregoing. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A heterostructure field effect transistor (HFET) comprising: a substrate; a semi-insulating gallium nitride (GaN) layer formed on the substrate; an aluminum gallium nitride (AlGaN) layer formed on the GaN layer; and a silicon carbide ($Si_xC_{1-x}$) functional layer formed on the AlGaN layer, wherein x of the $Si_xC_{1-x}$ functional layer has a value in a range of $0.6<x<1$, and wherein the $Si_xC_{1-x}$ functional layer is disposed to cover an entire surface of the AlGaN layer and is in physical contact with the AlGaN layer, and further comprising at least two electrodes formed on the substrate, the at least two electrodes being spaced apart in a direction transverse to a thickness direction of the substrate wherein the $Si_xC_{1-x}$ functional layer is arranged between the substrate and at least a portion of each of the at least two electrodes in the thickness direction.

2. The HFET of claim 1, wherein the $Si_xC_{1-x}$ functional layer corresponds to one of a single crystal silicon carbide, a polycrystal silicon carbide, and an amorphous silicon carbide.

3. The HFET of claim 1, wherein the $Si_xC_{1-x}$ functional layer is formed through an in-situ operation by metal organic chemical vapor deposition (MOCVD).

4. The HFET of claim 1, wherein a protection layer comprising at least one selected from the group consisting of silicon nitride (SiN), silicon oxide ($SiO_2$), and aluminum oxide ($Al_2O_3$) is formed on the $Si_xC_{1-x}$ functional layer.

5. The HFET of claim 1, wherein the substrate comprises at least one material selected from the group consisting of sapphire, silicon, aluminum nitride (AlN), silicon carbide (SiC), and GaN.

6. The HFET of claim 1, wherein a buffer layer comprising at least one material selected from a group consisting of AlN, SiC, and GaN is formed on the substrate.

7. The HFET of claim 1, wherein the HFET corresponds to one of a normally on device, a normally off device, and a Schottky barrier diode.

8. The HFET of claim 1, further comprising:
a GaN layer doped with Al that is disposed between the semi-insulating GaN layer formed on the substrate and the AlGaN layer formed on the GaN layer.

9. The HFET of claim 1, wherein the at least two electrodes include a gate electrode, a source electrode, and a drain electrode.

10. The HFET of claim 1, wherein the at least two electrodes include an anode and a cathode.

11. A heterostructure field effect transistor (HFET) comprising:
a substrate;
a semi-insulating gallium nitride (GaN) layer formed on the substrate;
an aluminum gallium nitride (AlGaN) layer formed on the GaN layer;
a silicon carbide ($Si_xC_{1-x}$) functional layer formed on the AlGaN layer, wherein x of the $Si_xC_{1-x}$ functional layer has a value in a range of $0<x<1$;
at least two electrodes formed on the substrate; and
a protection layer on portions of the $Si_xC_{1-x}$ functional layer on which the at least two electrodes are not formed,
wherein the $Si_xC_{1-x}$ functional layer is arranged between the substrate and at least a portion of each of the at least two electrodes in a thickness direction of the substrate, and
the at least a portion of each of the at least two electrodes are spaced apart in a direction transverse to the thickness direction.

* * * * *